(12) United States Patent
Ishiyama et al.

(10) Patent No.: US 12,336,381 B2
(45) Date of Patent: *Jun. 17, 2025

(54) DISPLAY PANEL AND DISPLAY DEVICE

(71) Applicant: JOLED INC., Tokyo (JP)

(72) Inventors: Yuichiro Ishiyama, Tokyo (JP); Takahiro Seki, Tokyo (JP)

(73) Assignee: JDI DESIGN AND DEVELOPMENT G.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/597,502

(22) Filed: Mar. 6, 2024

(65) Prior Publication Data

US 2024/0251588 A1 Jul. 25, 2024

Related U.S. Application Data

(63) Continuation of application No. 17/421,242, filed as application No. PCT/JP2020/000273 on Jan. 8, 2020, now Pat. No. 11,943,958.

(30) Foreign Application Priority Data

Jan. 9, 2019 (JP) .................................. 2019-001931

(51) Int. Cl.
*H01L 29/08* (2006.01)
*H10K 50/844* (2023.01)
(Continued)

(52) U.S. Cl.
CPC ........... *H10K 50/844* (2023.02); *H10K 59/12* (2023.02); *H10K 77/111* (2023.02)

(58) Field of Classification Search
CPC .. H10K 59/12; H10K 59/131; H10K 50/8426; H10K 59/123; H10K 2102/3026;
(Continued)

(56) References Cited

U.S. PATENT DOCUMENTS

| 2007/0173031 | A1 | 7/2007 | Kodaira et al. |
| 2010/0133993 | A1* | 6/2010 | Pang ..................... H10K 59/126 445/24 |
| 2010/0196679 | A1 | 8/2010 | Morishima |
| 2010/0301742 | A1* | 12/2010 | Moriwaki .......... H10K 59/8722 313/504 |

(Continued)

FOREIGN PATENT DOCUMENTS

| CN | 108258149 | | 7/2018 | |
| CN | 108258149 | A * | 7/2018 | ............... G09F 9/33 |

(Continued)

OTHER PUBLICATIONS

International Search Report (ISR) from International Searching Authority (Japan Patent Office) in International Pat. Appl. No. PCT/JP2020/000273, dated Mar. 17, 2020, together with an English language translation.

*Primary Examiner* — Niki H Nguyen
(74) *Attorney, Agent, or Firm* — Greenblum and Bernstein, P.L.C.

(57) ABSTRACT

A display panel includes a flexible substrate. The flexible substrate includes a display region and a peripheral region. A plurality of self-luminescent elements is on a first main face of the display region of the flexible substrate. A plurality of thin film transistor (TFT) circuits is between the first main face and the self-luminescent elements. The TFT circuits drive the self-luminescent elements. A first inorganic film is between the TFT circuits and the self-luminescent elements, and includes a step portion which is a thinned portion of the first inorganic film disposed in the peripheral region of the flexible substrate. A second inorganic film covers the self-luminescent elements. A resin layer overlaps the second inorganic film and overlaps at least a portion of the first inorganic film in contact with an end portion of the second inorganic film.

10 Claims, 14 Drawing Sheets

(51) Int. Cl.
*H10K 59/12* (2023.01)
*H10K 77/10* (2023.01)

(58) Field of Classification Search
CPC .... H10K 59/1216; H10K 59/40; H10K 50/81;
H10K 50/818; H10K 50/82; H10K 71/80;
H10K 50/858; H10K 59/121; H10K
85/342; H10K 59/17; H10K 50/155;
H10K 50/854; H10K 50/85; H10K
71/851; H10K 85/626; H10K 59/127;
H10K 50/121; H10K 2101/90; H10K
50/824; H10K 59/1315; H10K 71/861;
H10K 59/873; H10K 59/10; H10K
2101/40; H10K 10/464; H10K 2101/30;
H10K 50/816; H10K 85/10; H10K
50/844; H10K 77/111
See application file for complete search history.

(56) References Cited

U.S. PATENT DOCUMENTS

| | | | |
|---|---|---|---|
| 2012/0080669 A1* | 4/2012 | Yamazaki | H10K 59/8731 |
| | | | 257/E51.026 |
| 2014/0306288 A1 | 10/2014 | Adachi et al. | |
| 2017/0040569 A1* | 2/2017 | Watabe | H10K 59/12 |
| 2019/0123118 A1* | 4/2019 | Shu | H10K 71/233 |

FOREIGN PATENT DOCUMENTS

| | | |
|---|---|---|
| JP | 2003-195789 | 7/2003 |
| JP | 2007-227875 | 9/2007 |
| JP | 2009-037798 | 2/2009 |
| JP | 2010-224426 | 10/2010 |
| JP | 2014-220489 | 11/2014 |

* cited by examiner

DISPLAY PANEL AND DISPLAY DEVICE

CROSS-REFERENCE TO RELATED APPLICATIONS

This is a Continuation of U.S. patent application Ser. No. 17/421,242, filed Jul. 7, 2021, which is a National Stage Entry of International Patent Application No. PCT/JP2020/000273, filed Jan. 8, 2020, which claims the benefit of Japanese Patent Application No. 2019-001931, filed Jan. 9, 2019. The disclosure of each of these documents, including the specification, drawings, and claims, is incorporated herein by reference in its entirety.

TECHNICAL FIELD

The disclosure relates to a display panel and a display apparatus.

BACKGROUND ART

Display panels including self-luminescent elements such as organic electroluminescent (EL) device use thin film transistors (TFTs) to drive the self-luminescent elements. The display panel includes a frame portion including inorganic films of the TFTs are provided (Reference is made to PTLs 1 to 5 described below, for example).

CITATION LIST

Patent Literature

[PTL 1] Japanese Unexamined Patent Application Publication No. 2009-37798
[PTL 2] Japanese Unexamined Patent Application Publication No. 2007-227875
[PTL 3] Japanese Unexamined Patent Application Publication No. 2014-220489
[PTL 4] Japanese Unexamined Patent Application Publication No. 2003-195789
[PTL 5] Japanese Unexamined Patent Application Publication No. 2010-224426

SUMMARY OF INVENTION

Meanwhile, it is possible to make the display panel described above flexible by using a flexible substrate in the display panel. However, such a flexible display panel is likely to cause cracks in the inorganic film in the frame portion of the display panel while being carried or intentionally bent. Once a crack is formed in the inorganic film, external moisture can enter through the crack to cause a display failure, such as a dark spot. Accordingly, it is desirable to provide a display panel and a display apparatus that make it possible to suppress the occurrence of a display failure, such as a dark spot, due to a crack generated in the inorganic film.

A first display panel according to one embodiment of the disclosure includes: a flexible substrate; a plurality of self-luminescent elements provided on a first main face of the flexible substrate; and a plurality of TFT circuits provided between the first main face and the plurality of self-luminescent elements and driving the self-luminescent elements. The first display panel has a first inorganic film, a second inorganic film, and a resin layer. The first inorganic film is provided between the plurality of TFT circuits and the plurality of self-luminescent elements, covers the TFT circuits, and has a step portion. The step portion is a thinned portion of the first inorganic film opposed to an end portion of the flexible substrate. The second inorganic film covers the self-luminescent elements. The resin layer covers the second inorganic film and covers at least a portion of the first inorganic film in contact with an end portion of the second inorganic film.

A first display apparatus according to one embodiment of the disclosure includes the first display panel and a driver that drives the first display panel.

In the first display panel and the first display apparatus according to one embodiment of the disclosure, the step portion is formed in the first organic film covering the TFT circuits. The step portion is a thinned portion of the first inorganic film opposed to an end portion of the flexible substrate. Accordingly, if a crack is generated in the end portion of the first inorganic film while the first display panel is being carried or intentionally bent, the step portion helps prevent the crack from expanding. Further, in the first display panel and the first display apparatus according to one embodiment of the disclosure, the second inorganic film covering the self-luminescent elements is covered with the resin layer. Further, at least a portion of the first inorganic film in contact with an end portion of the second inorganic film is also covered with the resin layer. Accordingly, even if a crack generated in the end portion of the first inorganic film expands over the step portion, the resin layer helps prevent the crack from expanding through the portions of the first inorganic film and the second inorganic film covered with the resin layer.

A second display panel according to one embodiment of the disclosure includes: a flexible substrate; a plurality of self-luminescent elements provided on a first main face of the flexible substrate; and a plurality of TFT circuits provided between the first main face and the plurality of self-luminescent elements and driving the self-luminescent elements. The second display panel further includes an inorganic film and a resin layer. The inorganic layer is provided between the flexible substrate and the plurality of TFT circuits, covers the first main face, and has a step portion. The step portion is a thinned portion of the inorganic film opposed to an end portion of the flexible substrate. The resin layer covers the other portion of the inorganic film other than the thinned portion.

A second display apparatus according to one embodiment of the disclosure includes the second display panel and a driver that drives the second display panel.

In the second display panel and the second display apparatus according to one embodiment of the disclosure, the step portion is formed in the inorganic film covering the first main face of the flexible substrate. The step portion is a thinned portion of the inorganic film opposed to an end portion of the flexible substrate. Accordingly, if a crack is generated in the end portion of the inorganic film while the second display panel is being carried or intentionally bent, for example, the step portion helps prevent the crack from expanding. Further, in the second display panel and the second display apparatus according to one embodiment of the disclosure, the other portion of the inorganic film other than the thinned portion is covered with the resin layer. Accordingly, even if the crack generated in the end portion of the inorganic film expands over the step portion, the resin layer helps prevent the crack from expanding through the portion of the inorganic film covered with the resin layer.

In the first display panel and the first display apparatus according to one embodiment of the disclosure, the resin layer helps prevent a crack from expanding. Accordingly, it is possible to suppress the occurrence of a display failure, such as a dark spot, due to the crack generated in the first inorganic film.

In the second display panel and the second display apparatus according to one embodiment of the disclosure, the resin layer helps prevent a crack from expanding. Accordingly, it is possible to suppress the occurrence of a display failure, such as a dark spot, due to the crack generated in the inorganic film.

It is to be noted that the effects described hereinabove are mere examples. The effects according to an embodiment of the disclosure are not limited to those described hereinabove. The disclosure may further include other effects in addition to the effects described hereinabove.

MODES FOR CARRYING OUT THE INVENTION

Figure 1:
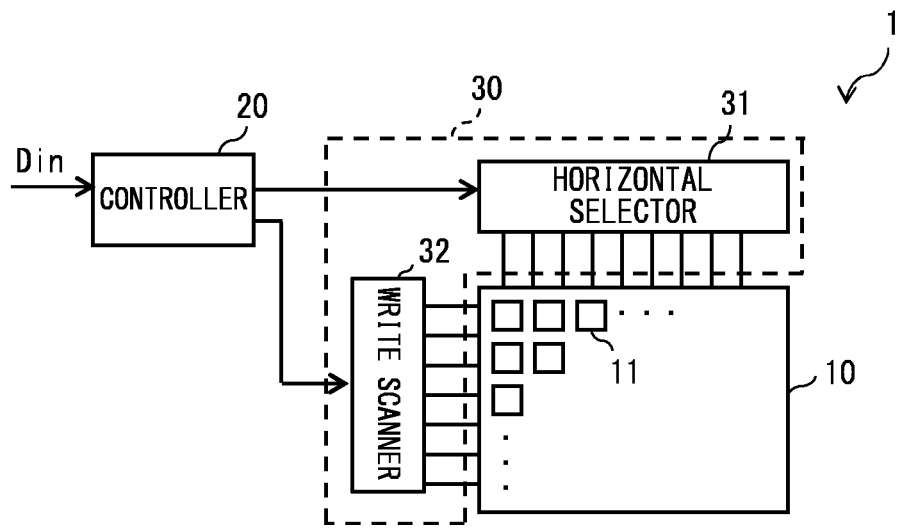
FIG. 1 is a diagram illustrating a schematic configuration example of a display apparatus according to a first embodiment of the disclosure.

In the following, some embodiments of the disclosure are described in detail with reference to the accompanying drawings. Note that the embodiments described below are preferred specific examples of the disclosure. Thus, factors including, without limitation, numerical values, shapes, materials, components, positions of the components, and how the components are coupled to each other are illustrative only and not to be construed as limiting to the disclosure. Further, elements in the following embodiments which are not recited in a most-generic independent claim of the disclosure are optional and may be provided on an as-needed basis. The drawings are schematic and are not intended to be drawn to scale and not necessarily strictly illustrated. Note that the like elements are denoted with the same reference numerals, and any redundant description thereof is omitted or simplified. Note that the description is given in the following order:

1. Embodiments (Display Apparatus)
2. Modification Examples (Display Apparatus)

1. Embodiments

Configuration

Figure 2:
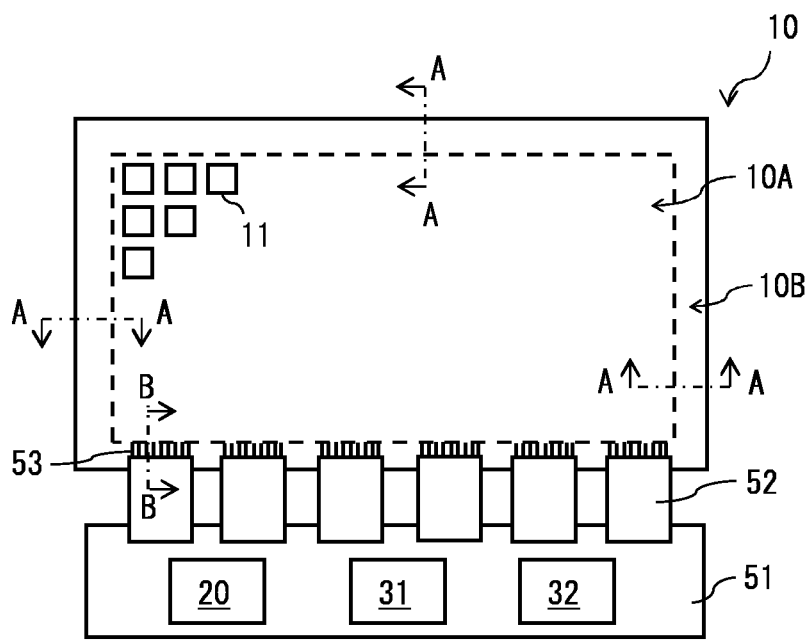
FIG. 2 is a diagram illustrating an exemplary connection between a display panel, a controller, and a driver illustrated in FIG. 1.
Figure 3:
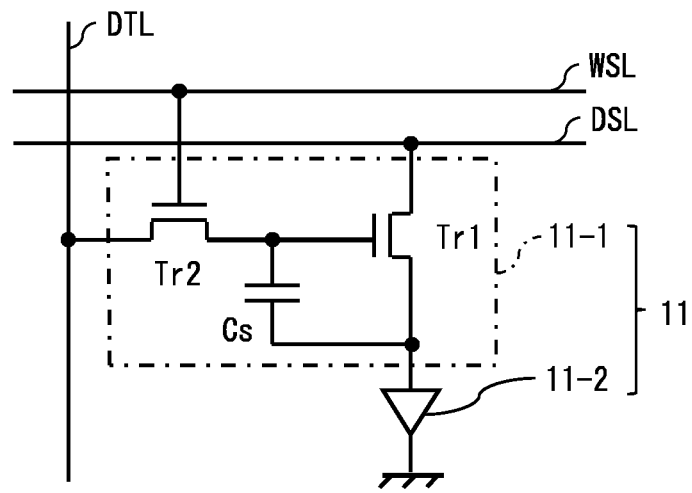
FIG. 3 is a diagram illustrating an exemplary circuit configuration of each pixel in the display apparatus illustrated in FIG. 1.

FIG. 1 illustrates a schematic configuration example of a display apparatus 1 according to one embodiment of the disclosure. The display apparatus 1 includes a display panel 10, a controller 20, and a driver 30, for example. FIG. 2 illustrates an exemplary connection between the display panel 10, the controller 20, and the driver 30. FIG. 3 illustrates an exemplary circuit configuration of each pixel 11 provided in the display apparatus 1.

The display panel 10 includes a plurality of pixels 11 arranged in matrix. The plurality of pixels 11 are provided in a display region 10A of the display panel 10. The display region 10A corresponds to an image display surface of the display panel 10. The display panel 10 has a frame region 10B surrounding the display region 10A. The frame region 10B has a frame shape surrounding the display region 10A. A plurality of mounting terminals are provided at one side of the frame region 10B. The plurality of mounting terminals 53 are electrically connected to the plurality of pixels 11 and flexible printed circuits (FPCs) 52. The controller 20 and the driver 30 are mounted on a control base 51 and electrically connected to the display panel 10 (the plurality of pixels 11) via the FPCs 52. The controller 20 and the driver 30 drive the display panel 10 (the plurality of pixels 11) on the basis of an image signal Din received from an external device.

Display Panel 10

In response to active-matrix driving of the pixels 11 performed by the controller 20 and the driver 30, the display panel 10 displays an image on the display region 10A on the basis of the image signal Din received from the external device. The display panel 10 includes multiple scanning lines WSL extending in a row direction, multiple signal lines DTL and multiple power lines DSL extending in a column direction, and the plurality of pixels 11 arranged in matrix.

The scanning line WSL is used to select the pixels 11. For example, the scanning line WSL supplies a selection pulse to any of the pixels 11 to select the pixels 11 on a predetermined unit basis (e.g., a pixel-row basis). The signal line DTL is used to supply a signal voltage corresponding to the image signal Din to each pixel 11. For example, the signal line DTL supplies a data pulse including a signal voltage to each pixel 11. The power line DSL supplies electric power to each pixel 11.

The pixels 11 in the display panel 10 include ones emitting red right, ones emitting green light, and ones emitting blue light. The pixel 11 emitting red light, the pixel 11 emitting green light, and the pixel 11 emitting blue light constitute a display pixel, which is a unit of display of a color image. Each display pixel may further include a pixel 11 emitting light of another color (e.g., white or yellow). Alternatively, each display pixel may include a plurality of pixels 11 emitting light of the same color (e.g., two pixels 11 emitting blue light).

Each of the signal lines DTL is coupled to an output terminal of a horizontal selector 31 to be described later. Each of the signal lines DTL is allocated to its corresponding pixel column, for example. Each of the scanning lines WSL is coupled to an output terminal of a write scanner 32 to be described later. Each of the scanning lines WSL is allocated to its corresponding pixel row, for example. Each of the power lines DSL is coupled to an output terminal of a power source. Each of the power lines DSL is allocated to its corresponding pixel row, for example.

Each pixel 11 includes a pixel circuit 11-1 and an organic electroluminescent element 11-2. The configuration of the organic electroluminescent element 11-2 will be described later.

The pixel circuit 11-1 controls light emission and light extinction of the organic electroluminescent element 11-2. The pixel circuit 11-1 has a function of holding a voltage written in each pixel 11 through write scanning. The pixel circuit 11-1 includes a driving transistor Tr1, a write transistor Tr2, and a storage capacitor Cs, for example.

The write transistor Tr2 controls an application of the signal voltage corresponding to the image signal Din to a gate of the driving transistor Tr1. For example, the write transistor Tr2 samples the voltage of the signal line DTL and write the sampled voltage into the gate of the driving transistor Tr1. The driving transistor Tr1 is coupled in series to the organic electroluminescent element 11-2. The driving transistor Tr1 drives the organic electroluminescent element 11-2. The driving transistor Tr1 controls an electric current flowing in the organic electroluminescent element 11-2 on the basis of the magnitude of the voltage sampled at the write transistor Tr2. The storage capacitor Cs holds a predetermined voltage between the gate and the source of the driving transistor Tr1. The storage capacitor Cs holds a constant voltage between the gate and the source of the driving transistor Tr1 for a predetermined period of time. Note that the pixel circuit 11-1 may have the 2Tr1C circuit configuration described above and additional capacitors and transistors. Alternatively, the pixel circuit 11-1 may have a circuit configuration different from the 2Tr1C circuit configuration described above.

Each of the signal lines DTL is coupled to the output terminal of the horizontal selector 31 to be described later and the source or drain of the write transistor Tr2. Each of the scanning lines WSL is coupled to the output terminal of the write scanner 32 to be described later and the gate of the write transistor Tr2. Each of the power lines DSL is coupled to a power supply circuit and the source or drain of the driving transistor Tr1.

The gate of the write transistor Tr2 is coupled to the scanning line WSL. One of the source and drain of the write transistor Tr2 is coupled to the signal line DTL. The other of the source and drain of the write transistor Tr2, which is not coupled to the signal line DTL, is coupled to the gate of the driving transistor Tr1. One of the source and drain of the driving transistor Tr1 is coupled to the power line DSL. The other of the source and drain of the driving transistor Tr1, which is not coupled to the power line DSL, is coupled to an anode 21 of the organic electroluminescent element 11-2. One end of the storage capacitor Cs is coupled to the gate of the driving transistor Tr1. The other end of the storage capacitor Cs is coupled to the source or drain of the driving transistor Tr1 whichever is adjacent to the organic electroluminescent element 11-2.

The driving transistor Tr1 and the write transistor Tr2 are general thin-film transistors (TFTs) and may have a reverse staggered structure (a so-called bottom gate type) or a staggered structure (top gate type). The structure of the driving transistor Tr1 and the write transistor Tr2 should not limited to a particular structure.

Driver 30

The driver 30 includes the horizontal selector 31 and the write scanner 32, for example. The horizontal selector 31 applies an analog signal voltage received from the controller 20 to each of the signal lines DTL in response to (in synchronization with) a control signal, for example. The write scanner 32 scans the pixels 11 on a predetermined unit basis.

Controller 20

The controller 20 will now be described. The controller 20 performs a predetermined correction on the digital image signal Din received from an external device, for example, and generates a signal voltage based on the image signal generated as a result of the correction. The controller 20 outputs the generated signal voltage to the horizontal selector 31, for example. For example, the controller 20 outputs a control signal to each circuit in the driver 30 in response to (in synchronization with) the control signal obtained from the image signal Din.

Figure 4:
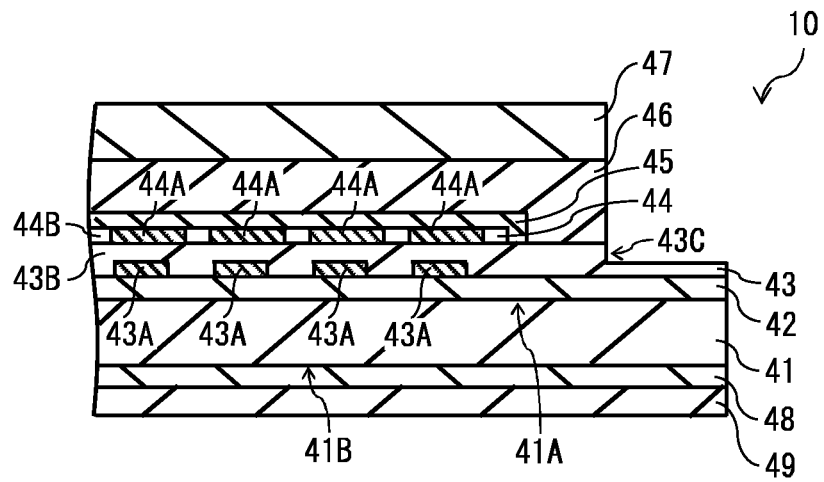
FIG. 4 is a diagram illustrating an exemplary cross-sectional configuration taken along a line A-A in FIG. 2.
Figure 5:
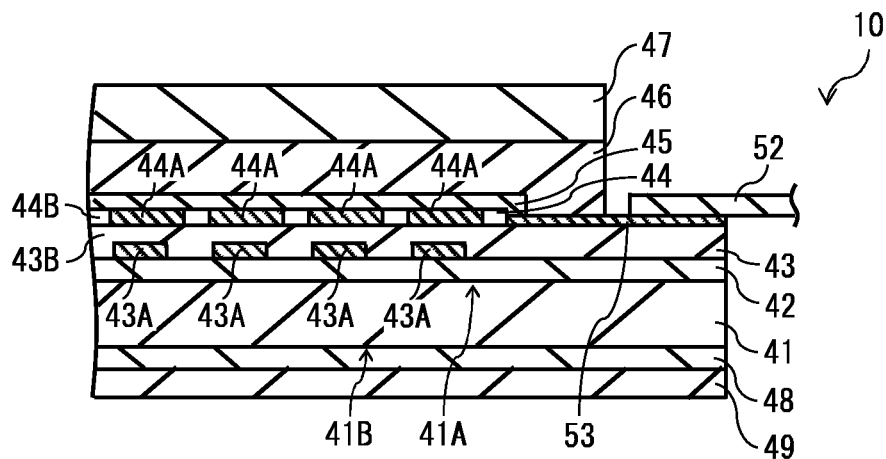
FIG. 5 is a diagram illustrating an exemplary cross-sectional configuration taken along a line B-B in FIG. 2.

Next, with reference to FIGS. 4 and 5, a cross-sectional configuration of the display panel 10 is described. FIG. 4 illustrates an exemplary cross-sectional configuration taken along a line A-A in FIG. 3. FIG. 5 illustrates an exemplary cross-sectional configuration taken along a line B-B in FIG. 3.

The display panel 10 includes a flexible substrate 41 and a plurality of organic electroluminescent elements 44A provided on a surface 41A (first main face) of the flexible substrate 41. The flexible substrate 41 is a film or sheet made of resin, for example. The flexible substrate 41 includes a methacrylic resin, such as polyimide (PI) or polymethylmethacrylate (PMMA), a polyester, such as polyethylene terephthalate (PET), polyethylene naphthalate(PEN), or polybutylene naphthalate (PBN), or a polycarbonate resin. The organic electroluminescent elements 44A correspond to the organic electroluminescent elements 11-2 described above.

The display panel 10 includes TFT circuits 43A provided between the surface 41A of the flexible substrate 41 and the organic electroluminescent elements 44A. The TFT circuits 43A drive the organic electroluminescent elements 44A. The TFT circuits 43A corresponds to the pixel circuits 11-1 described above.

The display panel 10 includes an inorganic insulating film 43B (first inorganic film) provided between the TFT circuits 43A and the organic electroluminescent elements 44A. The inorganic insulating film 43B covers the TFT circuits 43A. The inorganic insulating film 43B includes an inorganic material having low moisture absorbency, such as silicon oxide (SiOx), silicon nitride (SiNx), silicon nitride oxide (SiNxOy), titanium oxide (TiOx), or aluminum oxide (AlxOy).

The inorganic insulating film 43B has a step portion 43C. The step portion 43C is a thinned portion of the inorganic insulating film 43B opposed to an end portion of the flexible substrate 41. The portion of the inorganic insulating film 43B opposed to the end portion of the flexible substrate 41 is thinner than the other portion of the inorganic insulating film 43B opposed to the organic electroluminescent elements 44A. The difference in thickness between the portion opposed to the end portion of the flexible substrate 41 and the portion opposed to the organic electroluminescent elements 44A forms the step portion 43C. The step portion 43C is formed in the frame region 10B. The step portion 43C is formed so as not to be opposed to at least the mounting terminals 53. For example, the step portion 43C is formed along three sides of the frame region 10B other than the side along which the mounting terminals 53 are formed. The mounting terminals 53 are formed in a flat region of the surface of the inorganic insulating film 43B in which the step portion 43C is not formed, and are exposed on the surface of the inorganic insulating film 43B. Alternatively, the step portion 43C is formed on two sides of the frame region 10B perpendicular to the side along which the mounting terminals 53 are formed. In such a case, the display panel 10 is foldable only in the direction perpendicular to the side of the frame region 10B along which the mounting terminals 53 are formed.

The display panel 10 includes an inorganic insulating film 45 (second inorganic film) covering the organic electroluminescent elements 44A, and a resin layer 46 covering the inorganic insulating film 45 and covering at least a portion of the inorganic insulating film 43B in contact with an end portion of the inorganic insulating film 45. For example, the inorganic insulating film 45 includes an inorganic material having low moisture absorbency, such as silicon oxide (SiOx), silicon nitride (SiNx), silicon nitride oxide (SiNxOy), titanium oxide (TiOx), or aluminum oxide (AlxOy). An end portion of the resin layer 46 may be formed on the step portion 43C. In such a case, the resin layer 46 is in contact with the entire surface of the inorganic insulating film 45 and also in contact with from a portion of the inorganic insulating film 43B in contact with the end portion of the inorganic insulating film 45 to the step portion 43C. The resin layer 46 also serves as an adhesive layer, and includes an epoxy resin or an acrylic resin, for example. The resin layer 46 may include a thermosetting resin or an ultraviolet curing resin, for example.

In the display panel 10, the organic electroluminescent elements 44A are separated from each other by opening definition insulating portions 44B. Each of the organic electroluminescent elements 44A defined in outline is provided in each pixel 11. The opening definition insulating portions 44B and the organic electroluminescent elements 44A are formed on the same plane, forming an EL element layer 44.

The display panel 10 includes a UC barrier layer 42 between the flexible substrate 41 and the TFT circuits 43A. The UC barrier layer 42 entirely covers the surface 41A of the flexible substrate 41. The UC barrier layer 42 is an inorganic insulating film including an inorganic material having low moisture absorbency, such as silicon oxide (SiOx), silicon nitride (SiNx), silicon nitride oxide (SiNxOy), titanium oxide (TiOx), or aluminum oxide (AlxOy). The UC barrier layer 42 may be a single layer or a laminated layer including layers made of different materials.

The display panel 10 includes a sealing layer 47 provided so as to be opposed to the flexible substrate 41 and being in contact with the resin layer 46. The sealing layer 47 includes a resin material, such as an epoxy resin or a vinyl resin. The sealing layer 47 may have an optical function. The sealing layer 47 may be a polarization plate, for example.

The display panel 10 includes, in order, a resin layer 48 and a reinforcement layer 49 on a rear surface 41B of the flexible substrate 41. The resin layer 48 entirely covers the rear surface 41B of the flexible substrate 41. For example, the resin layer 48 serves as an adhesive layer that adheres the flexible substrate 41 to the reinforcement layer 49. The resin layer 48 includes an epoxy resin or an acrylic resin, for example. The reinforcement layer 49 serves as a reinforcing member that maintains the strength of the display panel 10, and a protective member that protects the back face of the display panel 10. For example, the reinforcement layer 49 includes a resin material, such as PET or PI, or a metal material, such as Al, Cu, or SUS.

Figure 6:
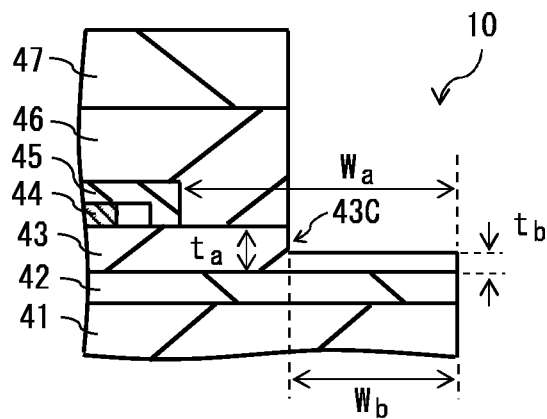
FIG. 6 is an enlarged view of a step portion illustrated in FIG. 4.

FIG. 6 illustrates the step portion 43C in an enlarged manner. The portion of the inorganic insulating film 43B opposed to the end portion of the flexible substrate 41 has a thickness tb. The portion of the inorganic insulating film 43B opposed to the organic electroluminescent elements 44A has a thickness ta. The length between the portion of the inorganic insulating film 43B in contact with the end portion of the inorganic insulating film 45 and the end portion of the inorganic insulating film 43B is indicated by Wa, and the length between the step portion 43C and the end portion of the inorganic insulating film 43B is indicated by Wb. In this case, it is preferable that the thickness tb be 3% or greater and 50% or less of the thickness ta. The length Wa is within a practical range of a narrow frame panel, for example, 1 mm or greater and 10 mm or less. The lower limit of the length Wb is a minimum length that prevents an initially-generated crack from reaching the step portion 43C, and may be, for example, 0.1 mm. The upper limit of the length Wb is a half of a maximum possible length of the length Wa, and may be, for example, 5 mm.

Figure 7A:
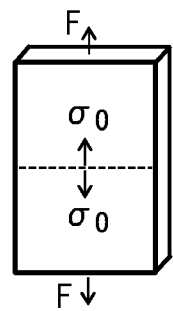
FIG. 7A and FIG. 7B are diagrams illustrating a design model of the step portion illustrated in FIG. 6.
Figure 7B:
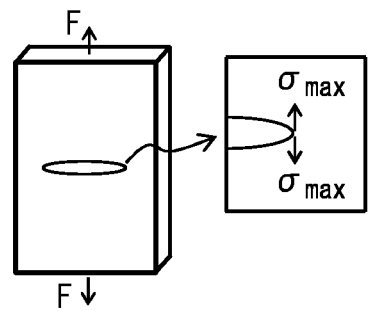

FIG. 7 illustrates a design model of the step portion 43C. As illustrated in FIG. 7(A), when a plate object is stretched from both sides with a force F, a stress $\sigma_0$ exerted on a cross-section perpendicular to the stretching direction is represented by F/(Bt), where "B" denotes the width of the object, and "t" denotes the thickness of the object. Further, as illustrated in FIG. 7(B), when an object in which an initial crack in the form of an oval hole is formed, is stretched from both sides with the force F, a stress $\sigma_{max}$ exerted on an end portion of the oval hole is represented by $\sigma_0 \times (1+2(a/\rho)^{1/2})$, where "2a" denotes the longitudinal length of the oval hole, "2b" denotes the lateral length of the oval hole, and "$\rho(=b^2/a)$" denotes the radius of curvature of an end portion of the oval hole.

Here, the stress $\sigma_{max}$ is in proportion to "1/t". Thus, a relationship represented by $\sigma_{max1}/\sigma_{max2}=t2/t1$ is hold between the stress $\sigma_{max1}$ exerted on the end portion of the oval hole formed in the inorganic insulating film 43B at a position opposed to the end portion of the flexible substrate 41 and the stress $\sigma_{max2}$ exerted on the end portion of the oval hole formed at a position opposed to the organic electroluminescent elements 44A.

Accordingly, assuming that a crack is generated in a film by a stress greater than a predetermined level, it is possible to make the portion of the inorganic insulating film 43B opposed to the organic electroluminescent elements 44A twice as resistant to a crack as the portion of the inorganic insulating film 43B opposed to the end of the flexible substrate 41 by setting the thickness ta to be twice of the thickness tb, for example.

Manufacturing Method

An exemplary method of manufacturing the display panel 10 will now be described. FIGS. 8A to 8F are cross-sectional views of the display panel 10 illustrating exemplary steps for manufacturing the display panel 10.

Figure 8A:
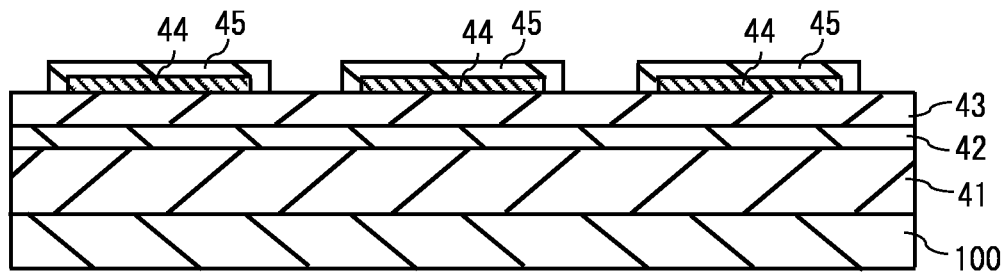
FIG. 8A is a diagram illustrating an exemplary step of manufacturing the display panel illustrated in FIG. 2.
Figure 8B:
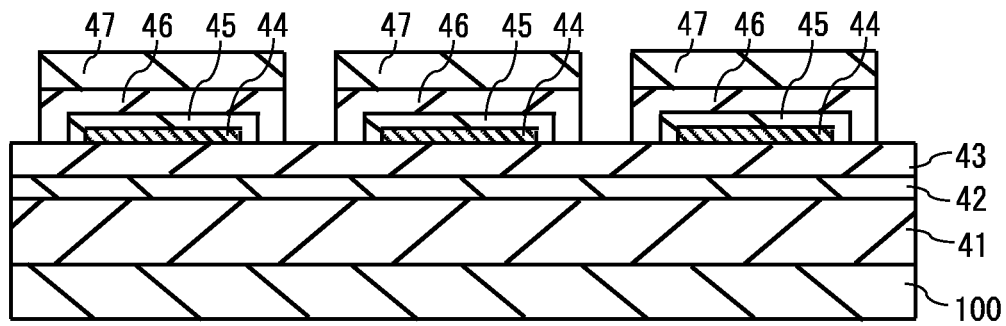
FIG. 8B is a diagram illustrating an exemplary manufacturing step following the step illustrated in FIG. 8A.
Figure 8C:
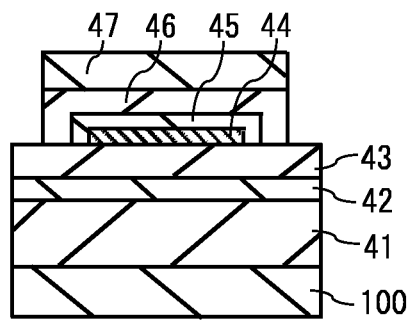
FIG. 8C(a) and FIG. 8C(b) are diagrams illustrating an exemplary manufacturing step following the step illustrated in FIG. 8B.
Figure 8C:
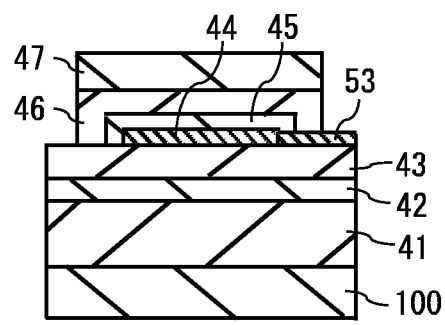

First, the flexible substrate 41, the UC barrier layer 42, and the TFT layer 43 are formed on a large supporting glass 100 (FIG. 8A). Thereafter, the EL element layer 44 and the inorganic insulating film 45 are formed in each section corresponding to the size of the display panel 10 (FIG. 8A). Thereafter, the sealing layer 47 is attached to the inorganic insulating film 45 with the resin layer 46 provided therebetween in each section corresponding to the size of the display panel 10 (FIG. 8B). Thereafter, the large supporting glass 100 is separated into the sections each corresponding to the size of the display panel 10 (FIGS. 8C(a) and 8C(b)). FIG. 8C(a) illustrates an exemplary cross-sectional configuration taken along the line A-A in FIG. 2, and FIG. 8C(b) illustrates an exemplary cross-sectional configuration taken along the line B-B in FIG. 2.

Figure 8D:
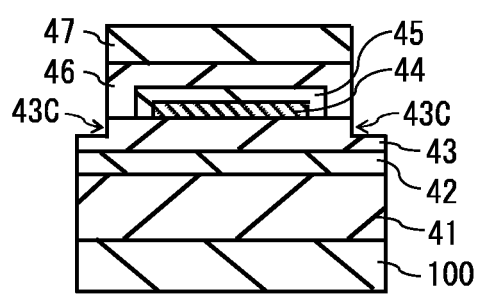
FIG. 8D(a) and FIG. 8D(b) are diagrams illustrating an exemplary manufacturing step following the step illustrated in FIG. 8C(a) and FIG. 8C(b).
Figure 8D:
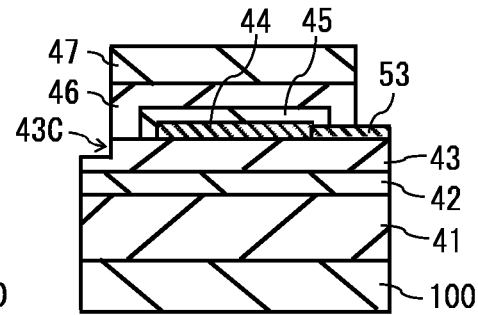
Figure 8E:
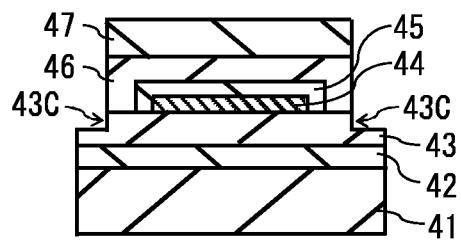
FIG. 8E(a) and FIG. 8E(b) are diagrams illustrating an exemplary manufacturing step following the step illustrated in FIG. 8D(a) and FIG. 8D(b).
Figure 8E:
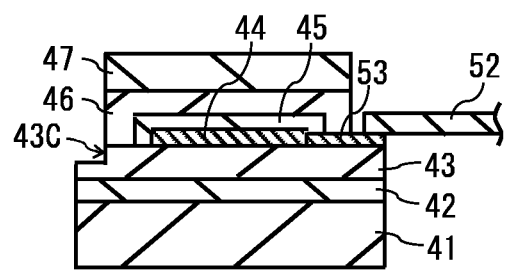
Figure 8F:
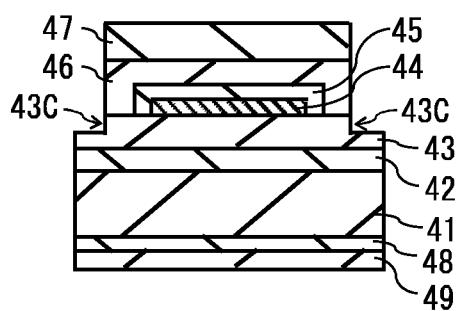
FIG. 8F(a) and FIG. 8F(b) are diagrams illustrating an exemplary manufacturing step following the step illustrated in FIG. 8E(a) and FIG. 8E(b).
Figure 8F:
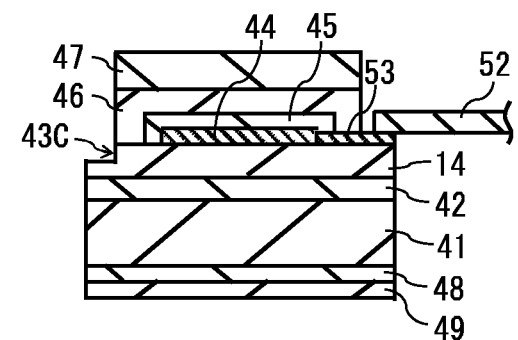

Next, the inorganic insulating film 43B of the TFT layer 43 is selectively etched using the sealing layer 47 as a mask (FIGS. 8D(a) and 8D(b)). The step portion 43C is thereby formed in the inorganic insulating film 43B. While the step portion 43C is being formed (i.e., while the inorganic insulating film 43B is being selectively etched using the sealing layer 47 as a mask), the inorganic insulating film 43B is etched into a desired thickness tb for a predetermined etching time that is calculated based on a preliminarily calculated etching rate of the inorganic insulating film 43B, for example. The front surfaces of the mounting terminals 53 are thereby exposed. Thereafter, the FPCs 52 are mounted on the respective mounting terminals 53 (FIGS. 8E(a) and 8E(b)). Lastly, the supporting glass 100 is removed, and the reinforcement layer 49 is attached to the rear surface of the flexible substrate 41 with the resin layer 48 provided therebetween (FIGS. 8F(a) and 8F(b)). The display panel 10 according to the present embodiment is manufactured as described above.

The display panel 10 may be produced by a method other than the method described above. FIGS. 9A to 9H are cross-sectional views illustrating exemplary steps for manufacturing the display panel 10.

Figure 9A:
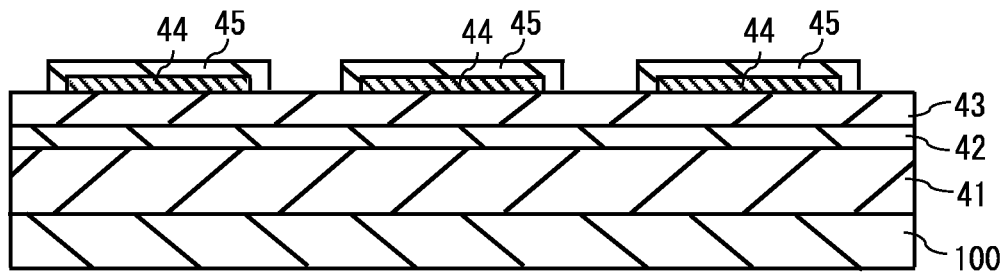
FIG. 9A is a diagram illustrating an exemplary step of manufacturing the display panel illustrated in FIG. 2.
Figure 9B:
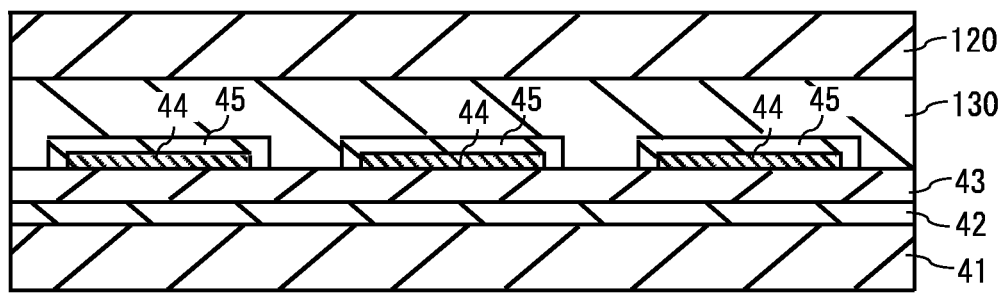
FIG. 9B is a diagram illustrating an exemplary manufacturing step following the step illustrated in FIG. 9A.

First, the flexible substrate 41, the UC barrier layer 42, and the TFT layer 43 are formed on the large supporting glass 100 (FIG. 9A). Thereafter, the EL element layer 44 and the inorganic insulating film 45 are formed in each section corresponding to the size of the display panel 10 (FIG. 9A). Thereafter, a supporting film 120 is attached to the entire surface including the inorganic insulating film 45 with the resin layer 130 provided therebetween, and then the supporting glass 100 is removed (FIG. 9B). Thereafter, the reinforcement layer 49 is attached to the rear surface of the flexible substrate 41 with the resin layer 48 provided therebetween (FIG. 9C).

Figure 9C:
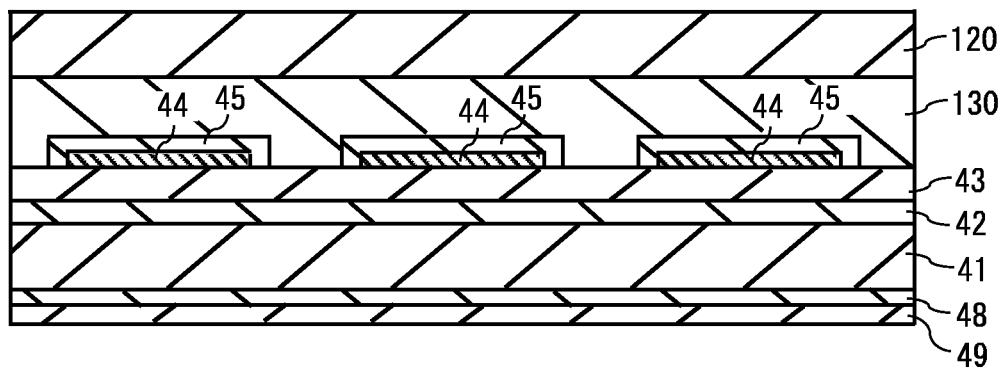
FIG. 9C is a diagram illustrating an exemplary manufacturing step following the step illustrated in FIG. 9B.
Figure 9D:
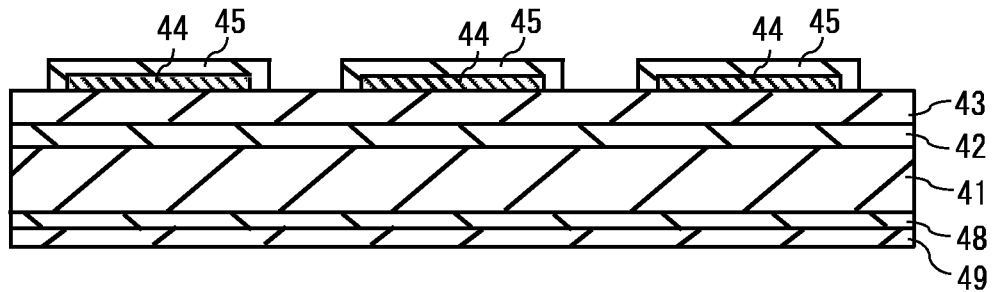
FIG. 9D is a diagram illustrating an exemplary manufacturing step following the step illustrated in FIG. 9C.
Figure 9E:
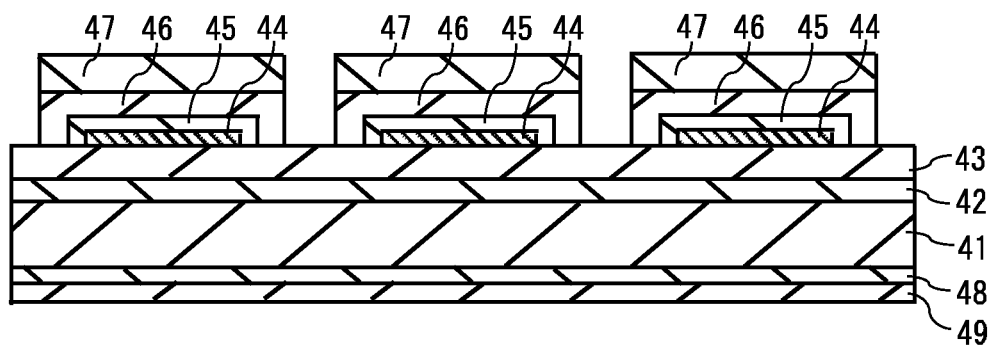
FIG. 9E is a diagram illustrating an exemplary manufacturing step following the step illustrated in FIG. 9D.
Figure 9F:
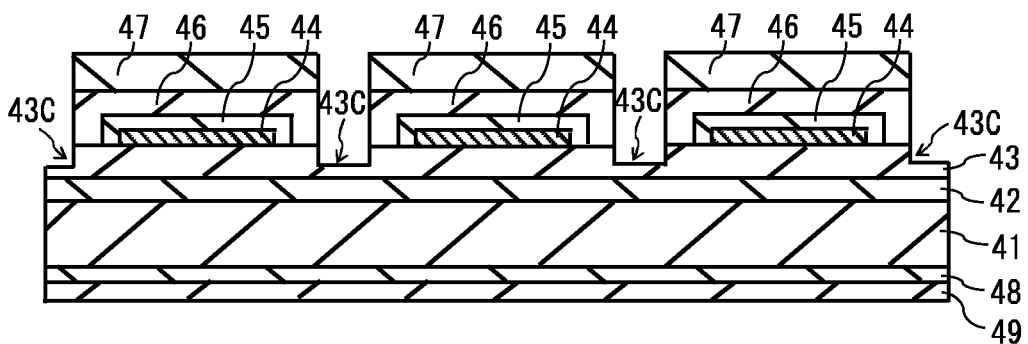
FIG. 9F is a diagram illustrating an exemplary manufacturing step following the step illustrated in FIG. 9E.
Figure 9G:
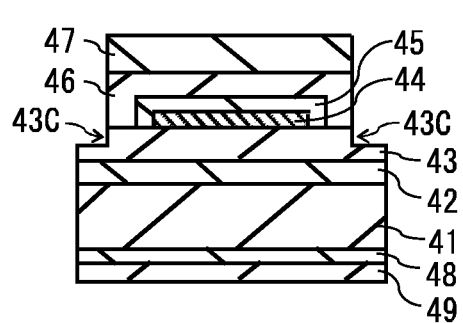
FIG. 9G(a) and FIG. 9G(b) are diagrams illustrating an exemplary manufacturing step following the step illustrated in FIG. 9F.
Figure 9G:
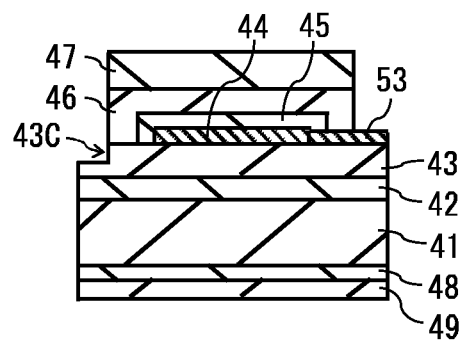
Figure 9H:
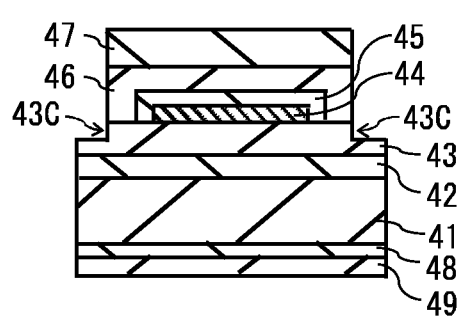
FIG. 9H(a) and FIG. 9H(b) are diagrams illustrating an exemplary manufacturing step following the step illustrated in FIG. 9G(a) and FIG. 9G(b).
Figure 9H:
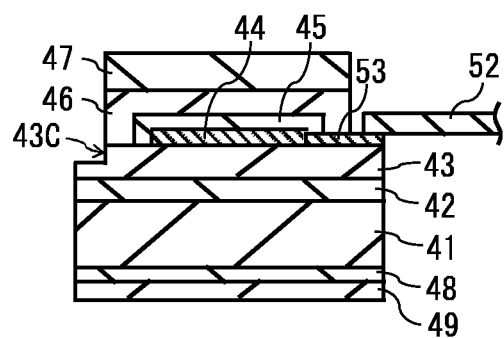

Next, the supporting film 120 and the resin layer 130 are removed (FIG. 9D), and the sealing layer 47 is attached to the inorganic insulating film 45 with the resin layer 46 provided therebetween in each section corresponding to the size of the display panel 10 (FIG. 9E). Thereafter, the inorganic insulating film 43B of the TFT layer 43 is selectively etched using the sealing layer 47 as a mask (FIG. 9F). The step portion 43C is thereby formed in the inorganic insulating film 43B. The front surfaces of the mounting terminals 53 are thereby exposed. Thereafter, the flexible substrate 41 is separated into the sections each corresponding to the size of the display panel 10 (FIGS. 9G(a) and 9G(b)). FIG. 9G(a) illustrates an exemplary cross-sectional configuration taken along the line A-A in FIG. 2, and FIG. 9G(b) illustrates an exemplary cross-sectional configuration taken along the line B-B in FIG. 2. Lastly, the FPCs 52 are mounted on the respective mounting terminals 53 (FIG. 9H(a) and 9H(b)). The display panel 10 of the present embodiment is manufactured as described above.

Figure 10A:
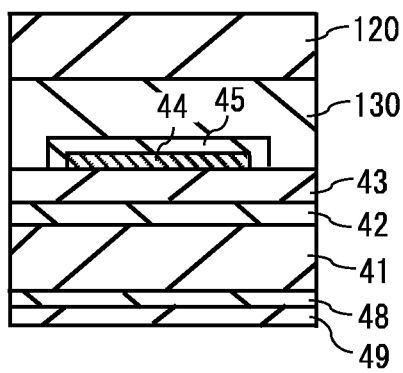
FIG. 10A(a) and FIG. 10A(b) are diagrams illustrating an exemplary step of manufacturing the display panel illustrated in FIG. 2.
Figure 10A:
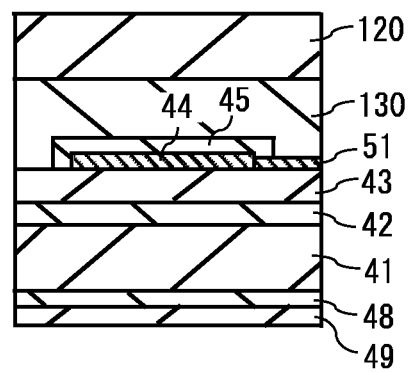
Figure 10B:
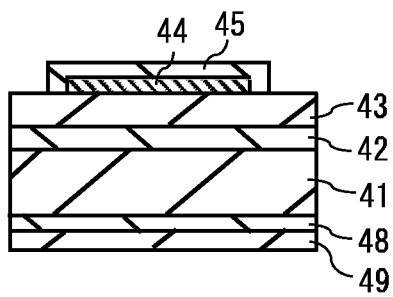
FIG. 10B(a) and FIG. 10B(b) are diagrams illustrating an exemplary manufacturing step following the step illustrated in FIG. 10A(a) and FIG. 10A(b).
Figure 10B:
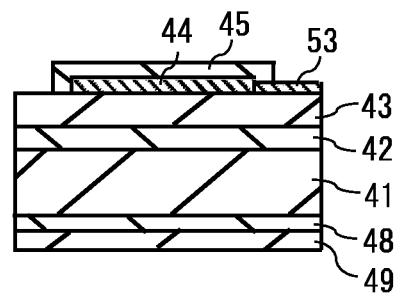
Figure 10C:
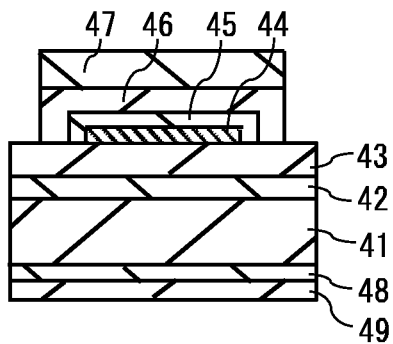
FIG. 10C(a) and FIG. 10C(b) are diagrams illustrating an exemplary manufacturing step following the step illustrated in FIG. 10B(a) and FIG. 10B(b).
Figure 10C:
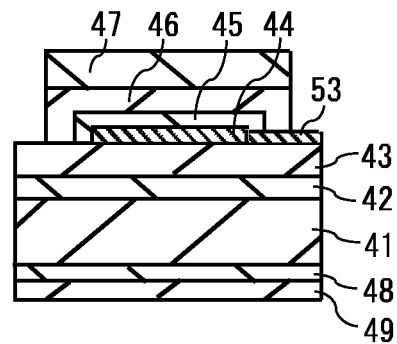

The display panel 10 may be produced by a method other than the methods described above. FIGS. 10A to 10C are cross-sectional views illustrating exemplary steps for manufacturing the display panel 10.

First, the same processes as those illustrated in FIGS. 9A to 9C are performed. Thereafter, the flexible substrate 41 is separated into sections each corresponding to the size of the display panel 10 (FIGS. 10A(a) and 10A(b)). FIG. 10A(a) illustrates an exemplary cross-sectional configuration taken along the line A-A in FIG. 2, and FIG. 10A(b) illustrates an exemplary cross-sectional configuration taken along the line B-B in FIG. 2. Thereafter, the supporting film 120 and the resin layer 130 are removed (FIGS. 10B(a) and 10B(b)), and the sealing layer 47 is attached to the inorganic insulating film 45 with the resin layer 46 provided therebetween in each section corresponding to the size of the display panel 10 (FIGS. 10C(a) and 10C(b)).

Next, the inorganic insulating film 43B of the TFT layer 43 is selectively etched using the sealing layer 47 as a mask (FIGS. 9G(a) and 9G(b)). The step portion 43C is thereby formed in the inorganic insulating film 43B. The front surfaces of the mounting terminals 53 are thereby exposed. Lastly, the FPCs 52 are mounted on the respective mounting terminals 53 (FIGS. 9H(a) and 9H(b)). The display panel 10 according to the present embodiment is manufactured as described above.

Effects

Some effects of the display panel 10 and the display apparatus 1 according to the present embodiment will now be described.

In the display panel including the self-luminescent element such as an organic electroluminescent element, the self-luminescent element is driven by the TFT. In the frame region of the display panel, the inorganic film of the TFT is provided. Meanwhile, it is possible to make the display panel flexible by using a flexible substrate in the display panel. However, such a flexible display panel is likely to cause a crack in the inorganic film in the frame portion of the display panel while being carried or intentionally bent. Once a crack is formed in the inorganic film, external moisture can enter through the crack to cause display failures, such as a dark spot.

However, in the present embodiment, the inorganic insulating film 43B covering the TFT circuit 43A has the step portion 43C, which is the thinned portion of the inorganic insulating film 43B opposed to the end portion of the flexible substrate 41. If a crack is generated at the end portion of the inorganic insulating film 43B while the display panel 10 is being carried or intentionally bent, the step portion 43C helps prevent the crack from expanding. Further, in the present embodiment, the inorganic insulating film 45 covering each organic electroluminescent element 44A is covered with the resin layer 46. The resin layer 46 also covers at least a portion of the inorganic insulating film 43B in contact with the end portion of the inorganic insulating film 45. Accordingly, even if a crack generated in the end portion of the the inorganic insulating film 43B expands over the step portion 43C, the resin layer 46 helps prevent the crack from expanding through the portions of the inorganic insulating film 43B and the inorganic insulating film 45 covered with the resin layer 46. As a result, it is possible to suppress the occurrence of a display failure, such as a dark spot, due to the crack generated in the inorganic insulating film 43B.

Further, in the present embodiment, the end portion of the resin layer 46 is formed on the step portion 43C. In this case, the resin layer 46 is in contact with the entire surface of the inorganic insulating film 45 and also in contact with from the portion of the inorganic insulating film 43B in contact with the end portion of the inorganic insulating film 45 to the step portion 43C. Accordingly, even if a crack generated in the end portion of the inorganic insulating film 43B expands over the step portion 43C, the resin layer 46 helps prevent the crack from expanding through the portions of the inorganic insulating film 43B and the inorganic insulating film 45 covered with the resin layer 46. As a result, it is possible to suppress the occurrence of a display failure, such as a dark spot, due to the crack generated in the inorganic insulating film 43B.

Further, in the present embodiment, the step portion 43C is formed so as not to be opposed to at least the mounting terminals 53. That is, the step portion 43C does not reach the region of the display panel 10 not to be intentionally bent. Thus, it is possible to provide the mounting terminals 53 in flat portions. As a result, the FPCs 52 are easily coupled to the mounting terminals 53.

2. Modification Examples

Modification examples of the display panel 10 according to the foregoing embodiment will now be described.

Modification Example A

Figure 11:
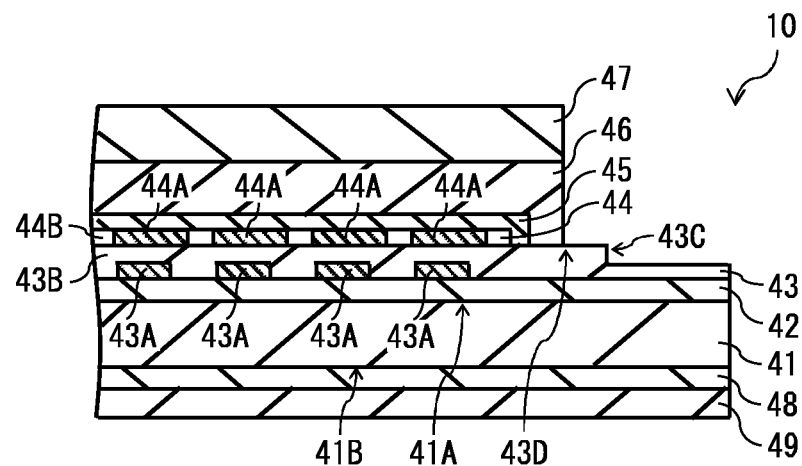
FIG. 11 is a diagram illustrating a cross-sectional configuration taken along the line A-A in FIG. 2 according to one modification example.

FIG. 11 illustrates a cross-sectional configuration taken along the line A-A in FIG. 4 according to one modification example. In the foregoing embodiment, the step portion 43C of the inorganic insulating film 43B and the vicinity thereof may be exposed without being covered with the resin layer 46. Even in such a case, the resin layer 46 covers at least the portion of inorganic insulating film 43B in contract with the end portion of the inorganic insulating film 45. The end portion of the resin layer 46 is in contact with the surface of the inorganic insulating film 43B in a region between the end portion of the inorganic insulating film 45 and the step portion 43C. A step portion 43D is formed in the portion where the end portion of the resin layer 46 is in contact with the surface of the inorganic insulating film 43B.

Accordingly, even if a crack generated in the end portion of the inorganic insulating film 43B expands over the step portion 43C, the resin layer 46 and the step portion 43D help prevent the crack from expanding through the portions of the inorganic insulating films 43B and 45 covered with the resin layer. As a result, it is possible to suppress the occurrence of a display failure, such as a dark spot, due to the crack generated in the inorganic insulating film 43B.

Modification Example B

Figure 12:
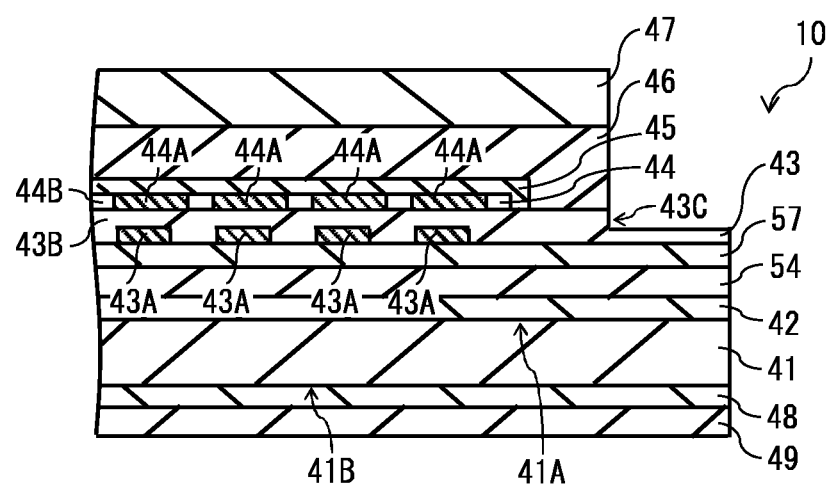
FIG. 12 is a diagram illustrating a cross-sectional configuration taken along the line A-A in FIG. 2 according to one modification example.
Figure 13:
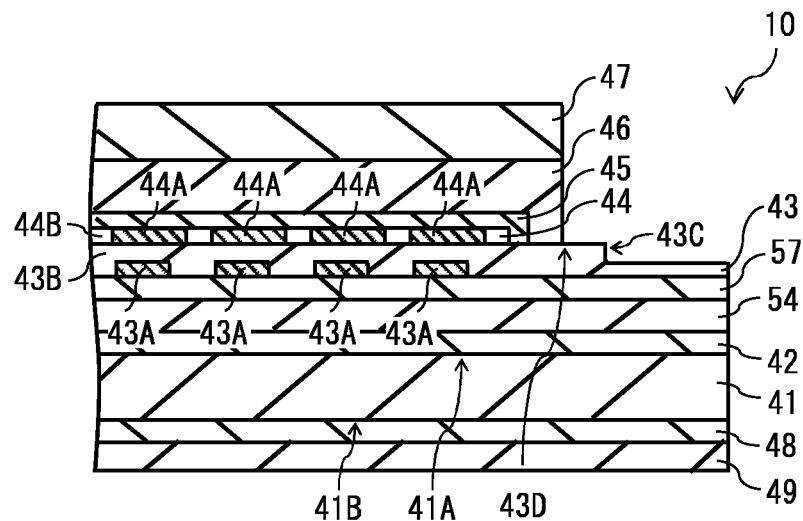
FIG. 13 is a diagram illustrating a cross-sectional configuration taken along the line A-A in FIG. 2 according to one modification example.

FIGS. 12 and 13 illustrate a cross-sectional configuration taken along the line A-A in FIG. 4 according to one modification example. In the foregoing embodiment and Modification Example A, the display panel 10 may include a resin layer 54 and a UC barrier layer 57 between the UC barrier layer 42 and the TFT layer 43. The resin layer 54 includes an epoxy resin or an acrylic resin, for example. The UC barrier layer 57 is an inorganic insulating film including an inorganic material having low moisture absorbency, such as silicon oxide (SiOx), silicon nitride (SiNx), silicon nitride oxide (SiNxOy), titanium oxide (TiOx), or aluminum oxide (AlxOy). The UC barrier layer 57 may be a single layer or a laminated layer including layers made of different materials. Accordingly, if a crack is generated at the UC barrier layers 42 or 57 while the display panel 10 is being carried or intentionally bent, for example, the resin layer 54 provided between the inorganic insulating film 43B or 45 and the UC barrier layer 42 helps prevent the crack from expanding through the inorganic insulating film 43B or 45. As a result, it is possible to suppress the occurrence of a display failure, such as a dark spot, due to the crack generated in the inorganic insulating film 43B.

Modification Example C

Figure 14:
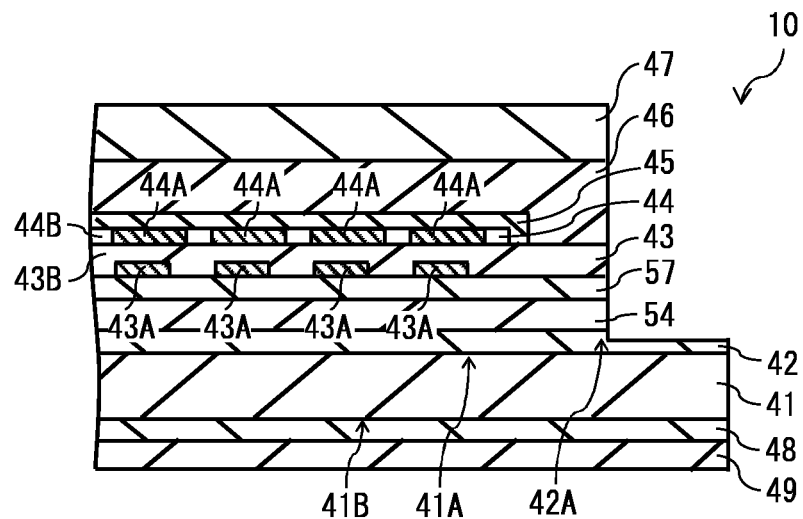
FIG. 14 is a diagram illustrating a cross-sectional configuration taken along the line A-A in FIG. 2 according to one modification example.

FIG. 14 illustrates a cross-sectional configuration taken along the line A-A in FIG. 4 according to one modification example. FIG. 14 illustrates an modification example of the cross-sectional configuration illustrated in FIG. 12. In Modification Example B described above, the step portion 43C is formed in the inorganic insulating film 43B. However, in Modification Example B described above, the inorganic insulating film 43B does not include the step portion 43C, and the UC barrier layer 42 may include the step portion 42A instead, as illustrated in FIG. 14, for example.

In this modification example, the surface of the end portion of the inorganic insulating film 43B does not include step portion 43C and is substantially flat. In contrast, the UC barrier layer 42 has the step portion 42A, which is a thinned portion of the UC barrier layer 42 opposed to the end portion of the flexible substrate 41. The portion of the UC barrier layer 42 opposed to the end portion of the flexible substrate 41 is thinner than the other portion of the UC barrier layer 42 opposed to the organic electroluminescent elements 44A. The difference in thickness between the portion opposed to the end portion of the flexible substrate 41 and the portion opposed to the organic electroluminescent elements 44A forms the step portion 42A. The step portion 42A is formed in the frame region 10B. The step portion 42A is formed so as not to be opposed to at least the mounting terminals 53. For example, the step portion 42A is formed along three sides of the frame region 10B other than the side along which the mounting terminals 53 are formed. The mounting terminals 53 are formed in a region of the surface of the UC barrier layer 42 opposed to the flat region in which step portion 42A is not formed. Alternatively, the step portion 42A is formed on two sides of the frame region 10B perpendicular to the side along which the mounting terminals 53 are formed. In such a case, the display panel 10 is foldable only in the direction perpendicular to the side of the frame region 10B along which the mounting terminals 53 are formed.

In this modification example, the resin layer 54 covers the portion of the UC barrier layer 42 other than the thinned portion of the UC barrier layer 42. The end portion of the resin layer 54 may be formed on the step portion 42A. In this case, the resin layer 54 is in contact with from a portion of the UC barrier layer 42 opposed to the TFT circuits 43A to the step portion 42A. The resin layer 54 may include polyimide, an epoxy resin, or an acrylic resin, for example.

Accordingly, even if a crack generated in the end portion of the UC barrier layer 42 expands over the step portion 42A, the resin layer 54 helps prevent the crack from expanding through the portion of the UC barrier layer 42 covered with the resin layer 54. As a result, it is possible to suppress the occurrence of a display failure, such as a dark spot, due to the crack generated in the UC barrier layer 42.

Figure 15:
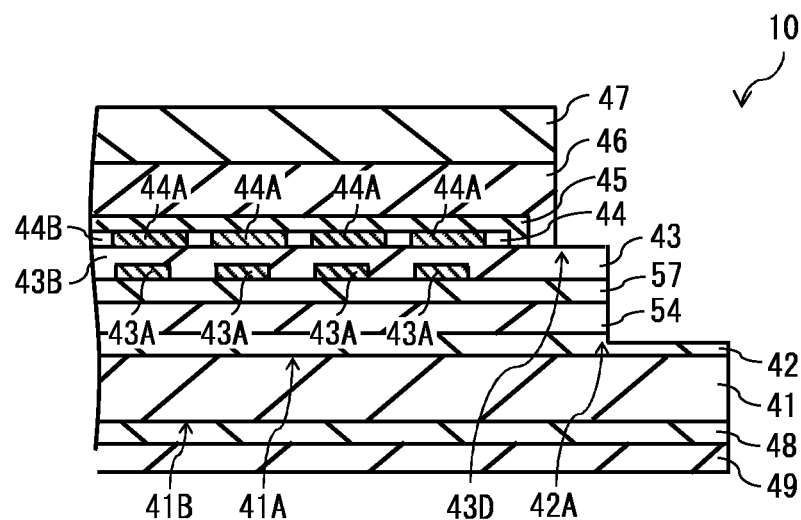
FIG. 15 is a diagram illustrating a cross-sectional configuration taken along the line A-A in FIG. 2 according to one modification example.

Further, in this modification example, the end portion of the TFT layer 43 provided in the vicinity of the step portion 42A may be exposed without being covered with the resin layer 46, as illustrated in FIG. 15, for example. Even in such a case, the resin layer 46 covers at least the portion of the inorganic insulating film 43B in contact with the end portion of the inorganic insulating film 45. Here, the end portion of the resin layer 46 is in contact with the surface of the inorganic insulating film 43B in the region between the end portion of the inorganic insulating film 45 and the end portion of the inorganic insulating film 43B. The step portion 43D is formed at a portion where the end portion of the resin layer 46 is in contact with the surface of the inorganic insulating film 43B.

Accordingly, even if a crack is generated in the end portion of the inorganic insulating film 43B, the resin layer 46 and the step portion 43D help prevent the crack from expanding through the portions of the inorganic insulating films 43B and 45 covered with the resin layer 46. As a result, it is possible to suppress the occurrence of a display failure, such as a dark spot, due to the crack generated in the inorganic insulating film 43B.

Although the disclosure is described hereinabove with reference to the embodiments and modification examples, the disclosure is not limited thereto and may be modified in various ways. It should be appreciated that the effects described herein are mere examples, and the effects of the disclosure should not be limited to the effects described herein. The disclosure may provide effects other than those described herein.

Modification Example D

Figure 16:
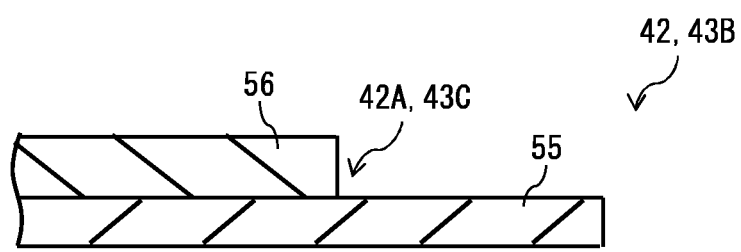
FIG. 16 is a diagram illustrating one modification example of the step portion illustrated in FIGS. 4 and 11 to 15.

FIG. 16 illustrates the step portion 42A in the UC barrier layer 42 or the step portion 43C in the inorganic insulating film 43B in an enlarged manner. In the foregoing embodiments and Modification Examples A, B, and C, the UC barrier layer 42 and the inorganic insulating film 43B may have a configuration in which an insulating material constituting the bottom surfaces of the step portions 42A and 43C and an insulating material constituting the side surfaces of the step portions 42A and 43C are different from each other. In the foregoing embodiments and Modification Examples A, B, and C, the UC barrier layer 42 and the inorganic insulating film 43B may each include the insulating film 55 constituting the bottom surface of the step portion 42A or 43C and the insulating film 56 constituting the side face of the step portion 42A or 43C, as illustrated in FIG. 16, for example. In this case, the insulating film 55 may include an inorganic material of which etching rate is lower than that of the insulating film 56 in terms of a predetermined etching gas or a predetermined etchant. For example, in the case of dry etching using a fluorine-containing gas, a silicon nitride film has a larger etching rate than a silicon oxide film. Thus, for example, the insulating film 56 includes silicon nitride (SiNx), and the insulating film 55 includes silicon oxide (SiOx). In such a case, according to the foregoing embodiments and Modification Examples A, B, and C, the insulating film 55 serve as an etching stop layer when the UC barrier layer 42 and the inorganic insulating film 43B are selectively etched. As a result, it is possible to precisely control the height of the step portions 42A and 43C in the manufacturing process.

Modification Example E

Figure 17:
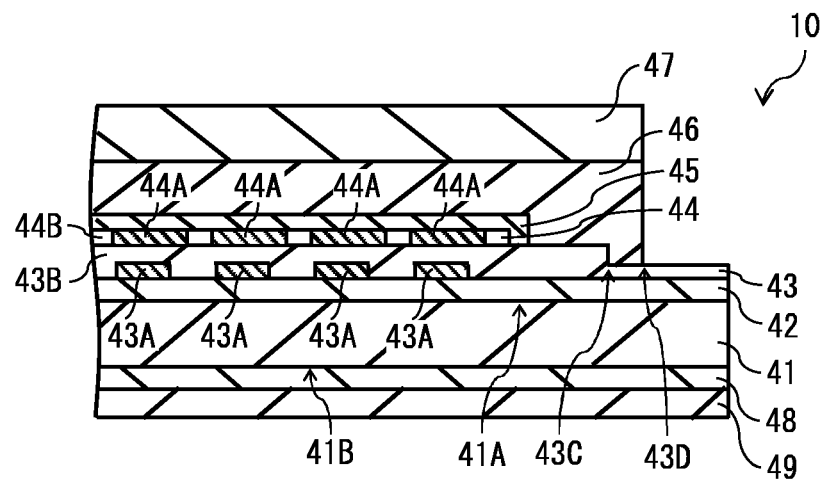
FIG. 17 is a diagram illustrating one modification example of the cross-sectional configuration illustrated in FIG. 4.
Figure 18:
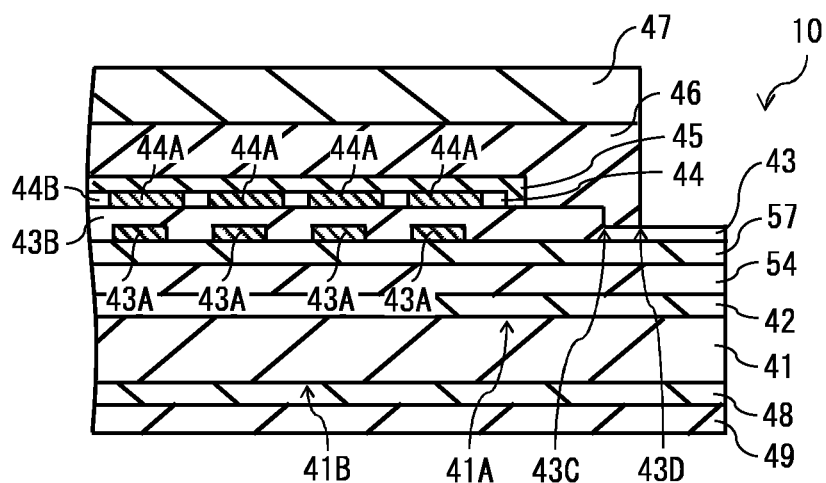
FIG. 18 is a diagram illustrating one modification example of the cross-sectional configuration illustrated in FIG. 12.

FIG. 17 illustrates a modification example of the cross-sectional configuration illustrated in FIG. 4. FIG. 18 illustrates a modification example of the cross-sectional configuration illustrated in FIG. 12. In the foregoing embodiments and Modification Example B, the resin layer 46 may be formed so as to be in contact with the entire surface of the inorganic insulating film 45, to be in contact with from a portion of the inorganic insulating film 43B in contact with the end portion of the inorganic insulating film 45 to the step portion 43C, and to cover the step portion 43C, as illustrated in FIGS. 17 and 18, for example. In this case, the end portion of the resin layer 46 is formed so as to be in contact with the portion of the inorganic insulating film 43B in the region between the end portion of the inorganic insulating film 43B and the step portion 43C. The step portion 43D is formed in the portion where the end portion of the resin layer 46 is in contact with the surface of the inorganic insulating film 43B. Such a structure is formed by, for example, selectively etching the TFT layer 43 using a film different from the polarization plate 47 as a mask to form the step portion 43C, and then selectively etching the resin layer 46 using the polarization plate 47 having a size enough to cover the step portion 43C as a mask to form the step portion 43D.

Accordingly, even if a crack generated in the end portion of the inorganic insulating film 43B expands over the step portion 43D, the resin layer 46 helps prevent the crack from expanding through the portions of the inorganic insulating films 43B and 45 covered with the resin layer 46. As a result, it is possible to suppress the occurrence of a display failure, such as a dark spot, due to the crack generated in the inorganic insulating film 43B.

Modification Example F

Figure 19:
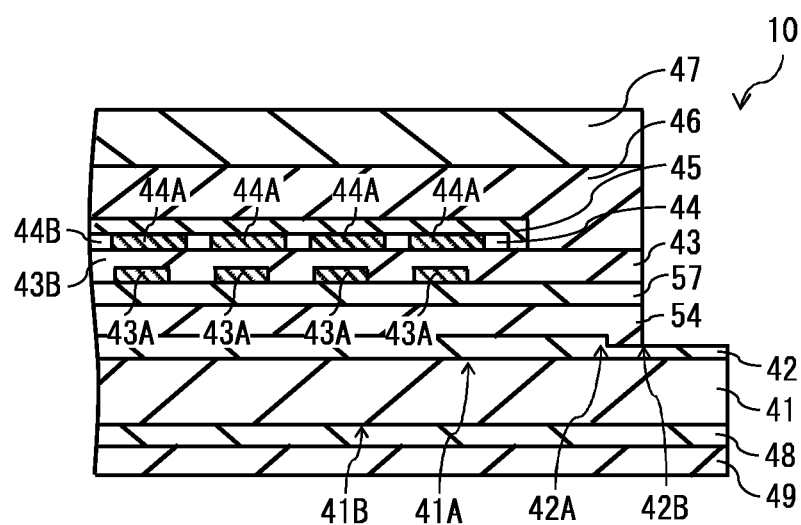
FIG. 19 is a diagram illustrating one modification example of the cross-sectional configuration illustrated in FIG. 14.

FIG. 19 illustrates a modification example of the cross-sectional configuration illustrated in FIG. 14. In Modification Example C described above, the resin layer 54 may be formed so as to cover the entire surface of the region of the UC barrier layer 42 opposed to the organic electroluminescent elements 44A and to cover the step portion 42A of the UC barrier layer 42, as illustrated in FIG. 19, for example. In this case, the end portion of the resin layer 54 is formed so as to be in contact with the portion of the UC barrier layer 42 in the region between the end portion of the UC barrier layer 42 and the step portion 42A. The step 42B is formed in the portion where the end portion of the resin layer 54 is in contact with the surface of the UC barrier layer 42. Such a structure is formed by, for example, selectively etching the UC barrier layer 42 using a layer different from the polarization plate 47 to form the step portion 42A, and then selectively etching the resin layer 54 using the polarization plate 47 having a size enough to cover the step portion 42A as a mask to form the step 42B.

Accordingly, even if a crack generated in the end portion of the UC barrier layer 42 expands over the step portion 42A, the resin layer 54 helps prevent the crack from expanding through the portion of the UC barrier layer 42 covered with the resin layer 54. As a result, it is possible to suppress the occurrence of a display failure, such as a dark spot, due to the crack generated in the UC barrier layer 42.

Further, the disclosure may take the following configurations, for example.
(1) A display panel including:
  a flexible substrate;
  a plurality of self-luminescent elements provided on a first main face of the flexible substrate;
  a plurality of thin film transistor (TFT) circuits provided between the first main face and the plurality of self-luminescent elements and driving the self-luminescent elements;
  a first inorganic film provided between the plurality of TFT circuits and the plurality of self-luminescent elements, covering the TFT circuits, and having a step portion, the step portion being a thinned portion of the first inorganic film opposed to an end portion of the flexible substrate;
  a second inorganic film covering the self-luminescent elements; and
  a resin layer covering the second inorganic film and covering at least a portion of the first inorganic film in contact with an end portion of the second inorganic film.
(2) The display panel according to (1), in which an end portion of the resin layer is formed on the step portion.
(3) The display panel according to (1), in which the resin layer is formed so as to cover the step portion.
(4) The display panel according to any one of (1) to (3), further including:
  a plurality of mounting terminals electrically coupled to the plurality of TFT circuits; and
  flexible printed circuits (FPC) joined to the plurality of mounting terminals, in which,
  the step portion is formed in the first inorganic film at a position not opposed to the mounting terminals.
(5) A display panel including:
  a flexible substrate;
  a plurality of self-luminescent elements provided on a first main face of the flexible substrate;
  a plurality of thin film transistor (TFT) circuits provided between the first main face and the plurality of self-luminescent elements and driving the self-luminescent elements;
  an inorganic film provided between the flexible substrate and the plurality of TFT circuits, covering the first main face, and having a step portion, the step portion being a thinned portion of the inorganic film opposed to an end portion of the flexible substrate; and
  a resin layer covering a portion of the inorganic film other than the thinned portion.
(6) The display panel according to (5), in which an end portion of the resin layer is formed on the step portion.
(7) The display panel according to (5), in which the resin layer is formed so as to cover the step portion.
(8) The display panel according to any one of (5) to (7), further including:
  a plurality of mounting terminals electrically coupled to the plurality of TFT circuits; and
  flexible printed circuits joined to the plurality of mounting terminals, in which
  the step portion is formed in the inorganic film at a position not opposed to the mounting terminals.
(9) A display apparatus including:
  a display panel; and
  a driver that drives the display panel, in which
  the display panel includes
  a flexible substrate,
  a plurality of self-luminescent elements provided on a first main face of the flexible substrate;
  a plurality of thin film transistor (TFT) circuits provided between the first main face and the plurality of self-luminescent elements and driving the self-luminescent elements,
  a first inorganic film provided between the plurality of TFT circuits and the plurality of self-luminescent elements, covering the TFT circuits, and having a step portion, the step portion being a thinned portion of the first inorganic film opposed to an end portion of the flexible substrate;
  a second inorganic film covering the self-luminescent elements; and
  a resin layer covering the second inorganic film and covering at least a portion of the first inorganic film in contact with an end portion of the second inorganic film.
(10) The display apparatus according to (9), further including:
  a plurality of mounting terminals electrically coupled to the plurality of TFT circuits; and
  flexible printed circuits (FPC) joined to the plurality of mounting terminals and the driver, in which
  the step portion is formed in the first inorganic film at a position not opposed to the mounting terminals.

(11) A display apparatus including:
a display panel; and
a driver that drives the display panel, in which
the display panel includes
a flexible substrate,
a plurality of self-luminescent elements provided on a first main face of the flexible substrate,
a plurality of thin film transistor (TFT) circuits provided between the first main face and the plurality of self-luminescent elements and driving the self-luminescent elements,
an inorganic film provided between the flexible substrate and the plurality of TFT circuits, covering the first main face, and having a step portion, the step portion being a thinned portion of the inorganic film opposed to an end portion of the flexible substrate, and
a resin layer covering a portion of the inorganic film other than the thinned portion.

(12) The display apparatus according to (11), further including:
a plurality of mounting terminals electrically coupled to the plurality of TFT circuits; and
flexible printed circuits (FPC) joined to the plurality of mounting terminals and the driver, in which
the step portion is formed in the inorganic film at a position not opposed to each of the mounting terminals.

The present application claims priority based on Japanese Patent Application No. 2019-001931 filed with the Japan Patent Office on Jan. 9, 2019, the entire contents of which are incorporated herein by reference.

It should be understood that those skilled in the art would make various modifications, combinations, sub-combinations, and alterations depending on design requirements and other factors, and they are within the scope of the attached claims or the equivalents thereof.

What is claimed is:

1. A display panel, comprising:
a flexible substrate including a display region and a peripheral region, the peripheral region being positioned in a periphery of the display region;
a plurality of self-luminescent elements provided on a first main face of the display region of the flexible substrate;
a plurality of thin film transistor (TFT) circuits provided between the first main face and the plurality of self-luminescent elements, the plurality of TFT circuits driving the plurality of self-luminescent elements;
a first inorganic film provided between the plurality of TFT circuits and the plurality of self-luminescent elements, and including a step portion which is a thinned portion of the first inorganic film and disposed in the peripheral region of the flexible substrate;
a second inorganic film covering the plurality of self-luminescent elements; and
a resin layer overlapping the second inorganic film and overlapping at least a portion of the first inorganic film in contact with an end portion of the second inorganic film.

2. The display panel according to claim 1, wherein the first inorganic film overlaps the plurality of TFT circuits.

3. The display panel according to claim 1, wherein the thinned portion includes a surface parallel to the first main face.

4. The display panel according to claim 1, wherein the thinned portion of the first inorganic film is opposed to an end portion of the first inorganic film.

5. The display panel according to claim 1, wherein the step portion is formed on a face of the first inorganic film farther from the flexible substrate.

6. A display apparatus, comprising:
a display panel; and
a driver that drives the display panel, wherein
the display panel includes:
a flexible substrate including a display region and a peripheral region, the peripheral region being positioned in a periphery of the display region;
a plurality of self-luminescent elements provided on a first main face of the display region of the flexible substrate;
a plurality of thin film transistor (TFT) circuits provided between the first main face and the plurality of self-luminescent elements, the plurality of TFT circuits driving the plurality of self-luminescent elements;
a first inorganic film provided between the flexible substrate and the plurality of TFT circuits, overlapping the first main face, and having a step portion which is a thinned portion of the first inorganic film and disposed in the peripheral region of the flexible substrate; and
a resin layer overlapping a portion of the first inorganic film other than the thinned portion.

7. The display apparatus according to claim 6, wherein the first inorganic film overlaps the plurality of TFT circuits.

8. The display apparatus according to claim 6, wherein the thinned portion has a surface parallel to the first main face.

9. The display apparatus according to claim 6, wherein the thinned portion of the first inorganic film is opposed to an end portion of the first inorganic film.

10. The display apparatus according to claim 6, wherein the step portion is formed on a face of the first inorganic film farther from the flexible substrate.

* * * * *